United States Patent
Sato et al.

(10) Patent No.: US 9,945,026 B2
(45) Date of Patent: Apr. 17, 2018

(54) FE-PT-BASED SPUTTERING TARGET WITH DISPERSED C GRAINS

(75) Inventors: Atsushi Sato, Ibaraki (JP); Shin-ichi Ogino, Ibaraki (JP)

(73) Assignee: JX Nippon Mining & Metals Corporation, Tokyo (JP)

(*) Notice: Subject to any disclaimer, the term of this patent is extended or adjusted under 35 U.S.C. 154(b) by 93 days.

(21) Appl. No.: 13/880,135

(22) PCT Filed: Nov. 14, 2011

(86) PCT No.: PCT/JP2011/076147
§ 371 (c)(1),
(2), (4) Date: Apr. 18, 2013

(87) PCT Pub. No.: WO2012/086335
PCT Pub. Date: Jun. 28, 2012

(65) Prior Publication Data
US 2013/0213803 A1    Aug. 22, 2013

(30) Foreign Application Priority Data
Dec. 20, 2010  (JP) ................ 2010-283567

(51) Int. Cl.
| | |
|---|---|
| H01B 1/02 | (2006.01) |
| C23C 14/34 | (2006.01) |
| B22F 3/14 | (2006.01) |
| C22C 33/02 | (2006.01) |
| G11B 5/851 | (2006.01) |

(52) U.S. Cl.
CPC ........... *C23C 14/3407* (2013.01); *B22F 3/14* (2013.01); *C22C 33/0228* (2013.01); *C23C 14/3414* (2013.01); *G11B 5/851* (2013.01); *H01B 1/02* (2013.01)

(58) Field of Classification Search
CPC .................................. C25D 7/00; H01B 1/02
USPC ................................................. 252/503, 513
See application file for complete search history.

(56) References Cited

U.S. PATENT DOCUMENTS

| | | | |
|---|---|---|---|
| 6,007,623 A * | 12/1999 | Thiele et al. | 117/95 |
| 6,071,323 A * | 6/2000 | Kawaguchi | 75/246 |
| 6,666,930 B2 | 12/2003 | Aoyama et al. | |
| 8,173,282 B1 * | 5/2012 | Sun et al. | 428/831 |
| 8,889,275 B1 * | 11/2014 | Yuan et al. | 428/829 |
| 2004/0110035 A1 | 6/2004 | Shin et al. | |

(Continued)

FOREIGN PATENT DOCUMENTS

| | | |
|---|---|---|
| JP | 2000-306228 A | 11/2000 |
| JP | 2000-311329 A | 11/2000 |
| JP | 2006-040542 A | 2/2006 |

*Primary Examiner* — William Young
(74) *Attorney, Agent, or Firm* — Howson & Howson LLP (57) ABSTRACT

A sintered compact sputtering target in which a composition ratio based on atomicity is represented by a formula of $(Fe_{100-x}-Pt_x)_{100-A}-C_A$ (provided A is a number which satisfies $20 \leq A \leq 50$ and X is a number which satisfies $35 \leq X \leq 55$), wherein C grains are finely dispersed in an alloy, and the relative density is 90% or higher. The production of a magnetic thin film with granular structure is provided without using an expensive simultaneous sputtering device, and a high-density sputtering target capable of reducing the amount of particles generated during sputtering is provided.

8 Claims, 1 Drawing Sheet

(56) References Cited

U.S. PATENT DOCUMENTS

| | | |
|---|---|---|
| 2007/0172706 A1* | 7/2007 | Chen .......................... 428/832 |
| 2007/0189916 A1 | 8/2007 | Zhang et al. |
| 2008/0057350 A1 | 3/2008 | Das et al. |
| 2009/0214897 A1 | 8/2009 | Sato |
| 2009/0301872 A1* | 12/2009 | Yahagi et al. ........... 204/298.13 |
| 2010/0047579 A1 | 2/2010 | Tokoro et al. |
| 2010/0165510 A1 | 7/2010 | Takahashi et al. |
| 2010/0200124 A1* | 8/2010 | Qiu et al. ...................... 148/527 |
| 2010/0243435 A1* | 9/2010 | Kato ......................... 204/298.03 |
| 2010/0246063 A1 | 9/2010 | Kamisawa et al. |
| 2011/0247930 A1 | 10/2011 | Sato |
| 2013/0168240 A1 | 7/2013 | Ogino et al. |
| 2013/0292245 A1 | 11/2013 | Ikeda et al. |
| 2013/0306470 A1 | 11/2013 | Ogino et al. |
| 2014/0083847 A1 | 3/2014 | Sato |
| 2014/0231250 A1 | 8/2014 | Ogino et al. |
| 2014/0346039 A1 | 11/2014 | Ogino |
| 2014/0360871 A1 | 12/2014 | Sato et al. |
| 2015/0060268 A1 | 3/2015 | Ogino |
| 2015/0107991 A1 | 4/2015 | Sato |

\* cited by examiner

FE-PT-BASED SPUTTERING TARGET WITH DISPERSED C GRAINS

BACKGROUND

The present invention relates to a sputtering target for use in the deposition of a granular-type magnetic thin film in a magnetic recording medium, and particularly relates to a Fe—Pt-based sputtering target in which C grains are dispersed.

In the field of magnetic recording as represented with a hard disk drive, a material based on Co, Fe or Ni, which are ferromagnetic metals, is used as a material of a magnetic thin film in the magnetic recording medium. For example, a Co—Cr-based or a Co—Cr—Pt-based ferromagnetic alloy having Co as its main component is being used for the magnetic thin film of a hard disk which adopts the longitudinal magnetic recording system.

Moreover, a compound material configured from a Co—Cr—Pt-based ferromagnetic alloy having Co as its main component and non-magnetic inorganic grains is often used for the magnetic thin film of a hard disk which adopts the perpendicular magnetic recording system that was recently put into practical application. In addition, the foregoing magnetic thin film is often produced by sputtering a target having the foregoing materials as its components with a DC magnetron sputtering device from the perspective of its high productivity.

Meanwhile, the recording density of hard disks is rapidly increasing year by year, and it is considered that the current surface density of 600 Gbit/in$^2$ will reach 1 Tbit/in$^2$ in the future. When the recording density reaches 1 Tbit/in$^2$, the size of the recording bit will fall below 10 nm. In the foregoing case, it is anticipated that the superparamagnetism caused by thermal fluctuation will become a problem, and it is further anticipated that the currently used magnetic recording medium material; for instance, a material with increased crystal magnetic anisotropy obtained by adding Pt to a Co—Cr-based alloy, will become insufficient. This is because the magnetic grains that stably behave ferromagnetically when the size is 10 nm or less need to possess higher crystal magnetic anisotropy.

Due to the foregoing reason, a FePt phase having an $L1_0$ structure is attracting attention as a material for an ultrahigh-density recording medium. Since the $L1_0$ FePt phase has high crystal magnetic anisotropy and also yields superior corrosion resistance and oxidation resistance, it is expected to be a material that is suitable for application as a magnetic recording medium.

In addition, upon using the FePt phase as a material for use as an ultrahigh-density recording medium, demanded is the development of technology of dispersing the ordered FePt magnetic grains in a state where the FePt magnetic grains are magnetically isolated and the orientation of these grains is densely arranged as much as possible.

In light of the above, for a magnetic recording medium of the next-generation hard disk which adopts the thermal assist magnetic recording system, proposed is a magnetic thin film with granular structure in which the FePt magnetic grains having an $L1_0$ structure are isolated by a nonmagnetic material such as oxide or carbon. This magnetic thin film with granular structure has a structure where the magnetic grains are magnetically insulated from each other through the intervention of a non-magnetic substance.

As magnetic recording mediums having a magnetic thin film with granular structure and related publications thereof, there are Patent Document 1, Patent Document 2, Patent Document 3, Patent Document 4, and Patent Document 5.

As a magnetic thin film with granular structure having the foregoing $L1_0$ FePt phase, a magnetic thin film containing C, as a non-magnetic substance, in a volume ratio of 10 to 50% is attracting attention particularly from the perspective of its high magnetic property. It is known that this kind of magnetic thin film with granular structure can be produced by simultaneously sputtering a Fe target, a Pt target, and a C target, or simultaneously sputtering a Fe—Pt alloy target and a C target. Nevertheless, an expensive simultaneous sputtering device is required for simultaneously sputtering the foregoing sputtering targets.

Moreover, when a sputtering device is used to sputter a sputtering target in which a nonmagnetic material is contained in an alloy, there is generally a problem in that the inadvertent desorption of the nonmagnetic material and abnormal discharge originating from the holes contained in the sputtering target will occur during sputtering, and particles (contaminant particles adhered onto the substrate) are consequently generated. In order to resolve the foregoing problems, it is necessary to increase the adhesion between the nonmagnetic material and the matrix alloy and highly densify the sputtering target. Generally speaking, a material of the sputtering target in which a nonmagnetic material is contained in an alloy is produced via the powder sintering method. However, when a large amount of C is included in Fe—Pt, it is difficult to obtain a high-density sintered compact since C is a sintering-resistant material.

[Patent Document 1] Japanese Laid-Open Patent Publication No. 2000-306228

[Patent Document 2] Japanese Laid-Open Patent Publication No. 2000-311329

[Patent Document 3] Japanese Laid-Open Patent Publication No. 2008-59733

[Patent Document 4] Japanese Laid-Open Patent Publication No. 2008-169464

[Patent Document 5] Japanese Laid-Open Patent Publication No. 2004-152471

SUMMARY OF INVENTION

Technical Problem

An object of this invention is to provide a Fe—Pt-based sputtering target with dispersed C grains which enables the production of a magnetic thin film with granular structure without using an expensive simultaneous sputtering device, as well as provide a high-density sputtering target capable of reducing the amount of particles generated during sputtering.

Solution to Problem

In order to achieve the foregoing object, as a result of intense study, the present inventors discovered that a high-density sputtering target can be produced by uniformly dispersing fine C grains, which are a nonmagnetic material, in a matrix metal. The sputtering target prepared as described above can considerably reduce the generation of particles. In other words, the present inventors discovered that the production yield during deposition can be improved thereby.

Based on the foregoing discovery, the present invention provides:

1) A sintered compact sputtering target in which a composition ratio based on atomicity is represented by a formula of $(Fe_{100-X}-Pt_X)_{100-A}-C_A$ (provided A is a number which satisfies 20≤A≤50 and X is a number which satisfies 35≤X≤55), wherein C grains are finely dispersed in an alloy, and the relative density is 90% or higher;

2) A sintered compact sputtering target in which a composition ratio based on atomicity is represented by a formula of $(Fe_{100-X-Y}-Pt_X-Cu_Y)_{100-A}-C_A$ (provided that A is a number which satisfies 20≤A≤50, X is a number which satisfies 35≤X≤55, and Y is a number which satisfies 0.5≤Y≤15), wherein C grains are finely dispersed in an alloy, and the relative density is 90% or higher;

3) The sputtering target according to 1) or 2) above, wherein a mean area of the C grains is 4 μm² or less in a polished structure on a cut surface of the sputtering target.

4) The sputtering target according to any one of 1) to 3) above, wherein C is graphite.

5) The sputtering target according to any one of 1) to 4) above, wherein an oxygen content in the sputtering target is 600 wtppm or less.

6) The sputtering target according to any one of 1) to 5) above, wherein the sputtering target contains, as an additive component, an oxide of one or more elements selected among B, Mg, Al, Si, Ti, Cr, Zr, Nb, and Ta in an amount of 20 mol % or less, and has a structure where the oxide is dispersed in an alloy.

The Fe—Pt-based sputtering target with dispersed C grains of the present invention enables the production of a magnetic thin film with granular structure without using an expensive simultaneous sputtering device, and the present invention additionally yields a superior effect of being able to provide a high-density sputtering target capable of reducing the amount of particles generated during sputtering.

DETAILED DESCRIPTION

The Fe—Pt-based sputtering target with dispersed C grains of the present invention has a composition ratio based on atomicity that is represented by a formula of $(Fe_{100-X}-Pt_X)_{100-A}-C_A$ (provided A is a number which satisfies 20≤A≤50 and X is a number which satisfies 35≤X≤55), C grains are finely and uniformly dispersed in a ferromagnetic matrix alloy, and the relative density is 90% or higher. This is the basic configuration of the present invention.

In the present invention, the content of C grains is preferably an atomic ratio of 20 or more and 50 or less in the sputtering target composition. When the content of C grains in the target composition is less than an atomic ratio of 20, there are cases where favorable magnetic property cannot be obtained. On the other hand, when the content of C grains exceeds an atomic ratio of 50, the C grains become agglomerated to increase the generation of particles.

Moreover, in the present invention, the content of Pt is preferably an atomic ratio of 35 or more and 55 or less in the Fe—Pt alloy composition. When the content of Pt in the Fe—Pt alloy is less than an atomic ratio of 35, there are cases where favorable magnetic property cannot be obtained. On the other hand, when the content of Pt exceeds an atomic ratio of 55, there are also cases where favorable magnetic property cannot be obtained.

The relative density being 90% or higher is an important factor of the present invention. When the relative density is high, there will hardly be any problem caused by the degassing from the sputtering target during the sputtering process and, since the adhesion between the alloy and the C grains will increase, the generation of particles can be effectively inhibited. Desirably, the relative density is 95% or higher.

In the present invention, the term "relative density" is a value obtained by dividing the measured density of the target by the calculated density (also known as the theoretical density). The term "calculated density" is a density that is obtained on the assumption that the constituents of the target coexist without mutually diffusing or reacting, and is calculated according to the following formula.

Formula: Calculated density=Σ(molecular weight of constituents×molar ratio of constituents)/Σ(molecular weight of constituents×molar ratio of constituents/literature density of constituents)

Here, Σ means to acquire the sum regarding all constituents of the target.

Moreover, with the sputtering target of the present invention, the ferromagnetic Fe—Pt—Cu alloy can be used as the matrix alloy. In other words, the sputtering target of the present invention has a composition ratio based on atomicity that is represented by a formula of $(Fe_{100-X-Y}-Pt_X-Cu_Y)_{100-A}-C_A$ (provided that A is a number which satisfies 20≤A≤50, X is a number which satisfies 35≤X≤55, and Y is a number which satisfies 0.5≤Y≤15), C grains are finely and uniformly dispersed in the matrix alloy, and the relative density is 90% or higher.

In the present invention, the content of Pt is preferably an atomic ratio of 35 or more and 55 or less in the Fe—Pt—Cu alloy composition. When the content of Pt in the Fe—Pt—Cu alloy is less than an atomic ratio of 35 or exceeds an atomic ratio of 55, there are cases where favorable magnetic property cannot be obtained.

Moreover, the content of Cu is preferably an atomic ratio of 0.5 or more and 15 or less in the Fe—Pt—Cu alloy composition. When the content of Cu in the Fe—Pt—Cu alloy is less than an atomic ratio of 0.5, there are cases where the heat treatment temperature cannot be sufficiently lowered upon causing the deposited magnetic thin film with granular structure to have an $L1_0$ structure. On the other hand, when the content of Cu exceeds an atomic ratio of 15, there are cases where favorable magnetic property cannot be obtained.

Moreover, with the sputtering target of the present invention, it is particularly effective to disperse C grains having a mean area of 4 μm² or less in the alloy. When the mean area exceeds 4 μm², the produced sputtering target is unable to effectively inhibit the generation of particles during sputtering. Note that the mean area is derived as a value obtained by dividing an area of the C grains observed on the polished surface of the mill ends cut out from the sputtering target by the number of such C grains.

Moreover, with the sputtering target of the present invention, C grains that are made of graphite are desirably used. This is because, when the C grains are graphitoid, the produced sputtering target can more effectively inhibit the generation of particles.

Moreover, the sputtering target of the present invention is particularly effective when the oxygen concentration is 600 wtppm or less, more preferably 500 wtppm or less. This will result in the reduction of the oxygen content in the Fe—Pt magnetic grains in the magnetic thin film that is produced by sputtering the target of the present invention, and the produced magnetic thin film can thereby obtain favorable magnetic property.

Moreover, the sputtering target of the present invention may contain, as an additive component, an oxide of one or more elements selected among B, Mg, Al, Si, Ti, Cr, Zr, Nb, and Ta in an amount of 20 mol % or less. In the magnetic thin film produced by sputtering the target of the present invention, the oxide, together with C, will take on a structure of insulating the magnetic interaction of the magnetic grains, and therefore, the produced magnetic thin film can have favorable magnetic property. Moreover, from the perspective of inhibiting the generation of particles during sputtering, desirably, the oxide is also finely dispersed in the alloy as with C. The lower limit of the additive amount preferably set to 1 mol %. This is because if the additive amount is less than this lower limit, there is no additive effect.

The sputtering target of the present invention is produced via the powder sintering method. For this production, respective raw material powders (Fe powder, Pt powder, Cu powder, C powder, oxide powder) are prepared. These powders desirably have a grain size of 0.5 μm or more and 10 μm or less. When the grain size of the raw material powder is too small, there is a problem in that the raw material powders tend to become agglomerated and, therefore, the grain size is desirably 0.5 μm or more. Meanwhile, when the grain size of the raw material powder is large, it becomes difficult to finely disperse the C grains in the alloy and, therefore, the grain size is desirably 10 μm or less.

In addition, as the raw material powder, alloy powders (Fe—Pt powder, Fe—Cu powder, Pt—Cu powder, Fe—Pt—Cu powder) may also be used. In particular, depending on the composition of the alloy powders containing Pt, alloy powders may be effective in reducing the amount of oxygen in the raw material powder. Even in cases of using alloy powders, the alloy powders desirably have a grain size of 0.5 μm or more and 10 μm or less.

In addition, the foregoing powders are weighed to achieve the intended composition, and pulverized and mixed by using a publicly known method such as a ball mill.

The mixed powder obtained thereby is molded and sintered via hot press. In addition to hot press, methods such as the plasma discharge sintering method and hot isostatic sintering method may also be used. The holding temperature during sintering will depend on the composition of the sputtering target, but in many cases the holding temperature is within the temperature range of 1200 to 1400° C.

Subsequently, hot isostatic pressing is performed to the sintered compact obtained from the hot press. Hot isostatic pressing is effective for improving the density of the sintered compact. The holding temperature during hot isostatic pressing will depend on the composition of the sintered compact, but in many cases the holding temperature is within the temperature range of 1200 to 1400° C. Moreover, the pressure is set to 100 Mpa or more.

The sintered compact obtained thereby is processed into an intended shape with a lathe in order to produce the sputtering target of the present invention.

Accordingly, it is possible to produce a high-density Fe—Pt-based sputtering target with dispersed C grains, in which C grains are finely and uniformly dispersed in the alloy. The sputtering target of the present invention produced as described above is effective as a sputtering target that is used for the deposition of a magnetic thin film with granular structure.

EXAMPLES

The present invention is now explained based on Examples and Comparative Examples. Note that these Examples are merely an example, and the present invention is not in any way limited to these Examples. In other words, the present invention is limited only by the patent claims, and covers various modifications other than the Examples included in the present invention.

Example 1

As the raw material powders, Fe powder having an average grain size of 3 μm, Pt powder having an average grain size of 3 μm, and C powder having an average grain size of 1 μm were prepared. As the C powder, commercially available amorphous carbon was used.

These powders were weighed to achieve a total weight of 2600 g based on the following atomic ratio.

Atomic ratio: $(Fe_{50}—Pt_{50})_{60}—C_{40}$

Subsequently, the weighed powders were placed in a ball mill pot with a capacity of 10 liters together with zirconia balls as the grinding medium, and the mill pot was rotated for 4 hours for mixing and pulverizing. The mixed powder that was removed from the ball mill was filled in a carbon mold and hot pressed.

The hot press conditions were as follows; namely, vacuum atmosphere, rate of temperature increase of 300° C./hour, holding temperature of 1200° C., and holding time of 2 hours, and pressure of 30 MPa was applied from the start of temperature increase to the end of holding. After the end of holding, the product was naturally cooled as is in a chamber.

Subsequently, hot isostatic pressing was performed to the sintered compact that was removed from the hot press mold. The hot isostatic pressing conditions were as follows; namely, rate of temperature increase of 300° C./hour, holding temperature of 1350° C., and holding time of 2 hours, and the Ar gas pressure was gradually increased from the start of temperature increase, and pressure of 150 MPa was applied during the holding at 1350° C. After the end of holding, the product was naturally cooled in the furnace.

The density of the sintered compact prepared as described above was measured with the Archimedian method, and the relative density was calculated. The result was 96.6%.

Subsequently, the end part of the obtained sintered compact was cut out, and the cross-section surface was polished to observe the structure thereof with an optical microscope. A structural image having a visual field size of 108 μm×80 μm was captured at four locations that were arbitrarily selected on the structure surface. The captured image was binarized using image-editing software to obtain the number and area of the portion (blackish portion in the structural observation image) corresponding to the C grains. As a result of calculating the mean area per one C grain, the result was 2.9 μm². Moreover, as a result of measuring the oxygen content in the sintered compact by using mill ends, the result was 560 wtppm.

Subsequently, the sintered compact was cut with a lathe into a shape having a diameter of 180.0 mm and a thickness of 5.0 mm, and thereafter mounted on a magnetron sputtering device (C-3010 sputtering system manufactured by Canon Anelva) to perform sputtering.

The sputtering conditions were input power of 1 kW and Ar gas pressure of 1.7 Pa, and, after performing pre-sputtering of 2 kWhr, deposition was performed onto a silicon substrate having a 4-inch diameter for 20 seconds.

The number of particles that adhered on the substrate was measured with a particle counter. The result was 410 particles.

Comparative Example 1

As the raw material powders, Fe powder having an average grain size of 3 μm, Pt powder having an average grain size of 3 μm, and C powder having an average grain size of 1 μm were prepared. As the C powder, commercially available amorphous carbon was used.

These powders were weighed to achieve a total weight of 2600 g based on the following atomic ratio.

Atomic ratio: $(Fe_{50}-Pt_{50})_{60}-C_{40}$

Subsequently, the weighed powders were placed in a ball mill pot with a capacity of 10 liters together with zirconia balls as the grinding medium, and the mill pot was rotated for 4 hours for mixing and pulverizing. The mixed powder that was removed from the ball mill was filled in a carbon mold and hot pressed.

The hot press conditions were as follows; namely, vacuum atmosphere, rate of temperature increase of 300° C./hour, holding temperature of 1200° C., and holding time of 2 hours, and pressure of 30 MPa was applied from the start of temperature increase to the end of holding. After the end of holding, the product was naturally cooled as is in a chamber.

The density of the sintered compact prepared as described above was measured with the Archimedian method, and the relative density was calculated. The result was 83.6%.

Subsequently, the end part of the obtained sintered compact was cut out, and the cross-section surface was polished to observe the structure thereof with an optical microscope. A structural image having a visual field size of 108 μm×80 μm was captured at four locations that were arbitrarily selected on the structure surface. The captured image was binarized using image-editing software to obtain the number and area of the portion (blackish portion in the structural observation image) corresponding to the C grains. As a result of calculating the mean area per one C grain, the result was 2.7 μm$^2$. Moreover, as a result of measuring the oxygen content in the sintered compact by using mill ends, the result was 620 wtppm.

Subsequently, the sintered compact was cut with a lathe into a shape having a diameter of 180.0 mm and a thickness of 5.0 mm, and thereafter mounted on a magnetron sputtering device (C-3010 sputtering system manufactured by Canon Anelva) to perform sputtering.

The sputtering conditions were input power of 1 kW and Ar gas pressure of 1.7 Pa, and, after performing pre-sputtering of 2 kWhr, deposition was performed onto a silicon substrate having a 4-inch diameter for 20 seconds. The number of particles that adhered on the substrate was measured with a particle counter. The result was 9640 particles.

Comparative Example 2

As the raw material powders, Fe powder having an average grain size of 3 μm, Pt powder having an average grain size of 3 μm, and C powder having an average grain size of 1 μm were prepared. As the C powder, commercially available amorphous carbon was used.

These powders were weighed to achieve a total weight of 2050 g based on the following atomic ratio.

Atomic ratio: $(Fe_{50}-Pt_{50})_{40}-C_{60}$

Subsequently, the weighed powders were placed in a ball mill pot with a capacity of 10 liters together with zirconia balls as the grinding medium, and the mill pot was rotated for 4 hours for mixing and pulverizing. The mixed powder that was removed from the ball mill was filled in a carbon mold and hot pressed.

The hot press conditions were as follows; namely, vacuum atmosphere, rate of temperature increase of 300° C./hour, holding temperature of 1200° C., and holding time of 2 hours, and pressure of 30 MPa was applied from the start of temperature increase to the end of holding. After the end of holding, the product was naturally cooled as is in a chamber.

Subsequently, hot isostatic pressing was performed to the sintered compact that was removed from the hot press mold. The hot isostatic pressing conditions were as follows; namely, rate of temperature increase of 300° C./hour, holding temperature of 1350° C., and holding time of 2 hours, and the Ar gas pressure was gradually increased from the start of temperature increase, and pressure of 150 MPa was applied during the holding at 1350° C. After the end of holding, the product was naturally cooled in the furnace.

The density of the sintered compact prepared as described above was measured with the Archimedian method, and the relative density was calculated. The result was 87.8%.

Subsequently, the end part of the obtained sintered compact was cut out, and the cross-section surface was polished to observe the structure thereof with an optical microscope. A structural image having a visual field size of 108 μm×80 μm was captured at four locations that were arbitrarily selected on the structure surface. The captured image was binarized using image-editing software to obtain the number and area of the portion (blackish portion in the structural observation image) corresponding to the C grains. As a result of calculating the mean area per one C grain, the result was 6.2 μm$^2$. Moreover, as a result of measuring the oxygen content in the sintered compact by using mill ends, the result was 820 wtppm.

Subsequently, the sintered compact was cut with a lathe into a shape having a diameter of 180.0 mm and a thickness of 5.0 mm, and thereafter mounted on a magnetron sputtering device (C-3010 sputtering system manufactured by Canon Anelva) to perform sputtering.

The sputtering conditions were input power of 1 kW and Ar gas pressure of 1.7 Pa, and, after performing pre-sputtering of 2 kWhr, deposition was performed onto a silicon substrate having a 4-inch diameter for 20 seconds. The number of particles that adhered on the substrate was measured with a particle counter. The result was 20000 particles or more.

Example 2

As the raw material powders, Fe powder having an average grain size of 3 μm, Pt powder having an average grain size of 3 μm, Cu powder having an average grain size of 3 μm, and C powder having an average grain size of 1 μm were prepared. As the C powder, commercially available amorphous carbon was used.

These powders were weighed to achieve a total weight of 2380 g based on the following atomic ratio.

Atomic ratio: $(Fe_{40}-Pt_{45}-Cu_{15})_{55}-C_{45}$

Subsequently, the weighed powders were placed in a ball mill pot with a capacity of 10 liters together with zirconia balls as the grinding medium, and the mill pot was rotated for 4 hours for mixing and pulverizing. The mixed powder that was removed from the ball mill was filled in a carbon mold and hot pressed.

The hot press conditions were as follows; namely, vacuum atmosphere, rate of temperature increase of 300° C./hour, holding temperature of 1200° C., and holding time of 2 hours, and pressure of 30 MPa was applied from the start of temperature increase to the end of holding. After the end of holding, the product was naturally cooled as is in a chamber.

Subsequently, hot isostatic pressing was performed to the sintered compact that was removed from the hot press mold. The hot isostatic pressing conditions were as follows; namely, rate of temperature increase of 300° C./hour, holding temperature of 1350° C., and holding time of 2 hours, and the Ar gas pressure was gradually increased from the start of temperature increase, and pressure of 150 MPa was applied during the holding at 1350° C. After the end of holding, the product was naturally cooled in the furnace.

The density of the sintered compact prepared as described above was measured with the Archimedian method, and the relative density was calculated. The result was 95.8%.

Subsequently, the end part of the obtained sintered compact was cut out, and the cross-section surface was polished to observe the structure thereof with an optical microscope. A structural image having a visual field size of 108 μm×80 μm was captured at four locations that were arbitrarily selected on the structure surface. The captured image was binarized using image-editing software to obtain the number and area of the portion (blackish portion in the structural observation image) corresponding to the C grains. As a result of calculating the mean area per one C grain, the result was 2.7 μm$^2$. Moreover, as a result of measuring the oxygen content in the sintered compact by using mill ends, the result was 540 wtppm.

Subsequently, the sintered compact was cut with a lathe into a shape having a diameter of 180.0 mm and a thickness of 5.0 mm, and thereafter mounted on a magnetron sputtering device (C-3010 sputtering system manufactured by Canon Anelva) to perform sputtering.

The sputtering conditions were input power of 1 kW and Ar gas pressure of 1.7 Pa, and, after performing pre-sputtering of 2 kWhr, deposition was performed onto a silicon substrate having a 4-inch diameter for 20 seconds. The number of particles that adhered on the substrate was measured with a particle counter. The result was 320 particles.

Comparative Example 3

As the raw material powders, Fe powder having an average grain size of 3 μm, Pt powder having an average grain size of 3 μm, Cu powder having an average grain size of 3 μm, and C powder having an average grain size of 1 μm were prepared. As the C powder, commercially available amorphous carbon was used.

These powders were weighed to achieve a total weight of 2380 g based on the following atomic ratio.

Atomic ratio: $(Fe_{40}-Pt_{45}-Cu_{15})_{55}-C_{45}$

Subsequently, the weighed powders were placed in a ball mill pot with a capacity of 10 liters together with zirconia balls as the grinding medium, and the mill pot was rotated for 4 hours for mixing and pulverizing. The mixed powder that was removed from the ball mill was filled in a carbon mold and hot pressed.

The hot press conditions were as follows; namely, vacuum atmosphere, rate of temperature increase of 300° C./hour, holding temperature of 1200° C., and holding time of 2 hours, and pressure of 30 MPa was applied from the start of temperature increase to the end of holding. After the end of holding, the product was naturally cooled as is in a chamber.

The density of the sintered compact prepared as described above was measured with the Archimedian method, and the relative density was calculated. The result was 85.7%.

Subsequently, the end part of the obtained sintered compact was cut out, and the cross-section surface was polished to observe the structure thereof with an optical microscope. A structural image having a visual field size of 108 μm×80 μm was captured at four locations that were arbitrarily selected on the structure surface. The captured image was binarized using image-editing software to obtain the number and area of the portion (blackish portion in the structural observation image) corresponding to the C grains. As a result of calculating the mean area per one C grain, the result was 2.5 μm$^2$. Moreover, as a result of measuring the oxygen content in the sintered compact by using mill ends, the result was 580 wtppm.

Subsequently, the sintered compact was cut with a lathe into a shape having a diameter of 180.0 mm and a thickness of 5.0 mm, and thereafter mounted on a magnetron sputtering device (C-3010 sputtering system manufactured by Canon Anelva) to perform sputtering.

The sputtering conditions were input power of 1 kW and Ar gas pressure of 1.7 Pa, and, after performing pre-sputtering of 2 kWhr, deposition was performed onto a silicon substrate having a 4-inch diameter for 20 seconds. The number of particles that adhered on the substrate was measured with a particle counter. The result was 11210 particles.

Example 3

As the raw material powders, Fe powder having an average grain size of 3 μm, Pt powder having an average grain size of 3 μm, and C powder having an average grain size of 1 μm were prepared. As the C powder, commercially available amorphous carbon was used.

These powders were weighed to achieve a total weight of 2600 g based on the following atomic ratio.

Atomic ratio: $(Fe_{50}-Pt_{50})_{60}-C_{40}$

Subsequently, the weighed powders were placed in a ball mill pot with a capacity of 10 liters together with zirconia balls as the grinding medium, and the mill pot was rotated for 16 hours for mixing and pulverizing. The mixed powder that was removed from the ball mill was filled in a carbon mold and hot pressed.

The hot press conditions were as follows; namely, vacuum atmosphere, rate of temperature increase of 300° C./hour, holding temperature of 1200° C., and holding time of 2 hours, and pressure of 30 MPa was applied from the start of temperature increase to the end of holding. After the end of holding, the product was naturally cooled as is in a chamber.

Subsequently, hot isostatic pressing was performed to the sintered compact that was removed from the hot press mold. The hot isostatic pressing conditions were as follows; namely, rate of temperature increase of 300° C./hour, holding temperature of 1350° C., and holding time of 2 hours, and the Ar gas pressure was gradually increased from the start of temperature increase, and pressure of 150 MPa was applied during the holding at 1350° C. After the end of holding, the product was naturally cooled in the furnace.

The density of the sintered compact prepared as described above was measured with the Archimedian method, and the relative density was calculated. The result was 96.9%.

Subsequently, the end part of the obtained sintered compact was cut out, and the cross-section surface was polished to observe the structure thereof with an optical microscope. A structural image having a visual field size of 108 μm×80 μm was captured at four locations that were arbitrarily selected on the structure surface. The captured image was binarized using image-editing software to obtain the number and area of the portion (blackish portion in the structural observation image) corresponding to the C grains. As a result of calculating the mean area per one C grain, the result was 1.0 μm$^2$. Moreover, as a result of measuring the oxygen content in the sintered compact by using mill ends, the result was 870 wtppm.

Figure 1:
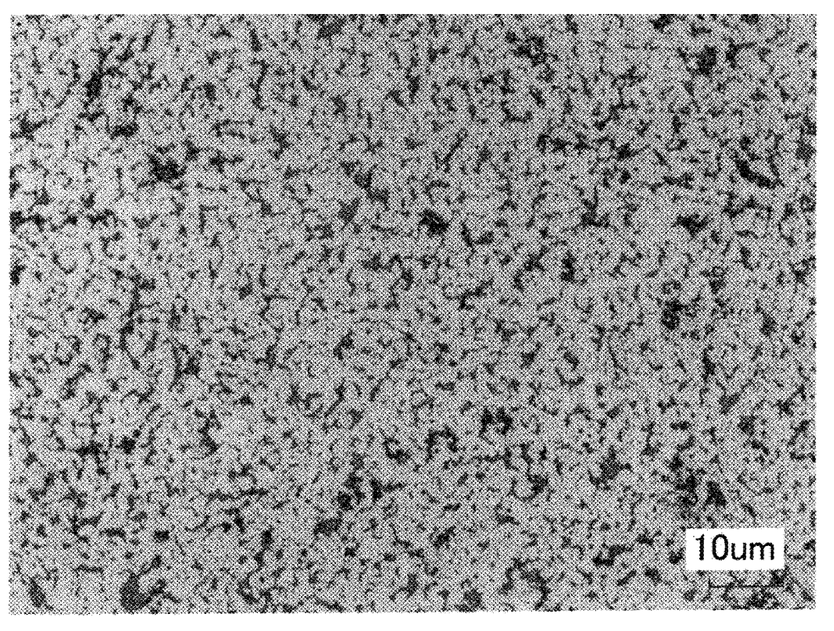
FIG. 1 This is a structural image upon observing the polished surface of the sputtering target of Example 3 under an optical microscope.

FIG. 1 shows a microscopic photo of the cross section surface. As shown in FIG. 1, it can be seen that the C grains (black portion) are uniformly dispersed in the alloy (white portion).

Subsequently, the sintered compact was cut with a lathe into a shape having a diameter of 180.0 mm and a thickness of 5.0 mm, and thereafter mounted on a magnetron sputtering device (C-3010 sputtering system manufactured by Canon Anelva) to perform sputtering.

The sputtering conditions were input power of 1 kW and Ar gas pressure of 1.7 Pa, and, after performing pre-sputtering of 2 kWhr, deposition was performed onto a silicon substrate having a 4-inch diameter for 20 seconds. The number of particles that adhered on the substrate was measured with a particle counter. The result was 230 particles.

Example 4

As the raw material powders, Fe powder having an average grain size of 3 μm, Pt powder having an average grain size of 3 μm, and C powder having an average grain size of 5 μm were prepared. As the C powder, graphite powder having a true specific gravity of 2.25 g/cc was used.

These powders were weighed to achieve a total weight of 2600 g based on the following atomic ratio.

Atomic ratio: $(Fe_{50}-Pt_{50})_{60}-C_{40}$

Subsequently, the weighed powders were placed in a ball mill pot with a capacity of 10 liters together with zirconia balls as the grinding medium, and the mill pot was rotated for 4 hours for mixing and pulverizing. The mixed powder that was removed from the ball mill was filled in a carbon mold and hot pressed.

The hot press conditions were as follows; namely, vacuum atmosphere, rate of temperature increase of 300° C./hour, holding temperature of 1200° C., and holding time of 2 hours, and pressure of 30 MPa was applied from the start of temperature increase to the end of holding. After the end of holding, the product was naturally cooled as is in a chamber.

Subsequently, hot isostatic pressing was performed to the sintered compact that was removed from the hot press mold. The hot isostatic pressing conditions were as follows; namely, rate of temperature increase of 300° C./hour, holding temperature of 1350° C., and holding time of 2 hours, and the Ar gas pressure was gradually increased from the start of temperature increase, and pressure of 150 MPa was applied during the holding at 1350° C. After the end of holding, the product was naturally cooled in the furnace.

The density of the sintered compact prepared as described above was measured with the Archimedian method, and the relative density was calculated. The result was 97.6%.

Subsequently, the end part of the obtained sintered compact was cut out, and the cross-section surface was polished to observe the structure thereof with an optical microscope. A structural image having a visual field size of 108 μm×80 μm was captured at four locations that were arbitrarily selected on the structure surface. The captured image was binarized using image-editing software to obtain the number and area of the portion (blackish portion in the structural observation image) corresponding to the C grains. As a result of calculating the mean area per one C grain, the result was 3.2 μm². Moreover, as a result of measuring the oxygen content in the sintered compact by using mill ends, the result was 600 wtppm.

Subsequently, the sintered compact was cut with a lathe into a shape having a diameter of 180.0 mm and a thickness of 5.0 mm, and thereafter mounted on a magnetron sputtering device (C-3010 sputtering system manufactured by Canon Anelva) to perform sputtering.

The sputtering conditions were input power of 1 kW and Ar gas pressure of 1.7 Pa, and, after performing pre-sputtering of 2 kWhr, deposition was performed onto a silicon substrate having a 4-inch diameter for 20 seconds. The number of particles that adhered on the substrate was measured with a particle counter. The result was 170 particles.

Example 5

As the raw material powders, Fe—Pt alloy powder having an average grain size of 10 μm, and C powder having an average grain size of 1 μm were prepared. As the C powder, commercially available amorphous carbon was used.

These powders were weighed to achieve a total weight of 2600 g based on the following atomic ratio.

Atomic ratio: $(Fe_{50}-Pt_{50})_{60}-C_{40}$

Subsequently, the weighed powders were placed in a ball mill pot with a capacity of 10 liters together with zirconia balls as the grinding medium, and the mill pot was rotated for 8 hours for mixing and pulverizing. The mixed powder that was removed from the ball mill was filled in a carbon mold and hot pressed.

The hot press conditions were as follows; namely, vacuum atmosphere, rate of temperature increase of 300° C./hour, holding temperature of 1200° C., and holding time of 2 hours, and pressure of 30 MPa was applied from the start of temperature increase to the end of holding. After the end of holding, the product was naturally cooled as is in a chamber.

Subsequently, hot isostatic pressing was performed to the sintered compact that was removed from the hot press mold. The hot isostatic pressing conditions were as follows; namely, rate of temperature increase of 300° C./hour, holding temperature of 1350° C., and holding time of 2 hours, and the Ar gas pressure was gradually increased from the start of temperature increase, and pressure of 150 MPa was applied during the holding at 1350° C. After the end of holding, the product was naturally cooled in the furnace.

The density of the sintered compact prepared as described above was measured with the Archimedian method, and the relative density was calculated. The result was 97.1%.

Subsequently, the end part of the obtained sintered compact was cut out, and the cross-section surface was polished to observe the structure thereof with an optical microscope. A structural image having a visual field size of 108 μm×80 μm was captured at four locations that were arbitrarily selected on the structure surface. The captured image was binarized using image-editing software to obtain the number and area of the portion (blackish portion in the structural observation image) corresponding to the C grains. As a result of calculating the mean area per one C grain, the result was 2.6 μm². Moreover, as a result of measuring the oxygen content in the sintered compact by using mill ends, the result was 280 wtppm.

Subsequently, the sintered compact was cut with a lathe into a shape having a diameter of 180.0 mm and a thickness of 5.0 mm, and thereafter mounted on a magnetron sputtering device (C-3010 sputtering system manufactured by Canon Anelva) to perform sputtering.

The sputtering conditions were input power of 1 kW and Ar gas pressure of 1.7 Pa, and, after performing pre-sputtering of 2 kWhr, deposition was performed onto a silicon substrate having a 4-inch diameter for 20 seconds.

The number of particles that adhered on the substrate was measured with a particle counter. The result was 360 particles.

Example 6

As the raw material powders, Fe powder having an average grain size of 3 μm, Pt powder having an average grain size of 3 μm, C powder having an average grain size of 1 μm, and SiO$_2$ powder having an average grain size of 1 μm were prepared. As the C powder, graphite powder having a true specific gravity of 2.25 g/cc was used.

These powders were weighed to achieve a total weight of 2600 g based on the following atomic ratio.

Atomic ratio: (Fe$_{50}$—Pt$_{50}$)$_{69}$—C$_{10}$—Si$_7$—O$_{14}$

Subsequently, the weighed powders were placed in a ball mill pot with a capacity of 10 liters together with zirconia balls as the grinding medium, and the mill pot was rotated for 4 hours for mixing and pulverizing. The mixed powder that was removed from the ball mill was filled in a carbon mold and hot pressed.

The hot press conditions were as follows; namely, vacuum atmosphere, rate of temperature increase of 300° C./hour, holding temperature of 1200° C., and holding time of 2 hours, and pressure of 30 MPa was applied from the start of temperature increase to the end of holding. After the end of holding, the product was naturally cooled as is in a chamber.

Subsequently, hot isostatic pressing was performed to the sintered compact that was removed from the hot press mold. The hot isostatic pressing conditions were as follows; namely, rate of temperature increase of 300° C./hour, holding temperature of 1200° C., and holding time of 2 hours, and the Ar gas pressure was gradually increased from the start of temperature increase, and pressure of 150 MPa was applied during the holding at 1200° C. After the end of holding, the product was naturally cooled in the furnace.

The density of the sintered compact prepared as described above was measured with the Archimedian method, and the relative density was calculated. The result was 98.6%.

Subsequently, the end part of the obtained sintered compact was cut out, and the cross-section surface was polished to observe the structure thereof with an electron-beam microanalyzer. An element distribution of the polished surface having a visual field size of 80 μm×80 μm was captured at four locations that were arbitrarily selected on the structure surface. The captured element distribution image of C was binarized using image-editing software to obtain the number and area of the portion corresponding to the C grains. As a result of calculating the mean area per one C grain, the result was 2.5 μm$^2$.

Subsequently, the sintered compact was cut with a lathe into a shape having a diameter of 180.0 mm and a thickness of 5.0 mm, and thereafter mounted on a magnetron sputtering device (C-3010 sputtering system manufactured by Canon Anelva) to perform sputtering.

The sputtering conditions were input power of 1 kW and Ar gas pressure of 1.7 Pa, and, after performing pre-sputtering of 2 kWhr, deposition was performed onto a silicon substrate having a 4-inch diameter for 20 seconds. The number of particles that adhered on the substrate was measured with a particle counter. The result was 120 particles.

Comparative Example 4

As the raw material powders, Fe powder having an average grain size of 3 μm, Pt powder having an average grain size of 3 μm, C powder having an average grain size of 20 μm, and SiO$_2$ powder having an average grain size of 1 μm were prepared. As the C powder, graphite powder having a true specific gravity of 2.25 g/cc was used.

These powders were weighed to achieve a total weight of 2600 g based on the following atomic ratio.

Atomic ratio: (Fe$_{50}$—Pt$_{50}$)$_{69}$—C$_{10}$—Si$_7$—O$_{14}$

Subsequently, the weighed powders were placed in a ball mill pot with a capacity of 10 liters together with zirconia balls as the grinding medium, and the mill pot was rotated for 4 hours for mixing and pulverizing. The mixed powder that was removed from the ball mill was filled in a carbon mold and hot pressed.

The hot press conditions were as follows; namely, vacuum atmosphere, rate of temperature increase of 300° C./hour, holding temperature of 1200° C., and holding time of 2 hours, and pressure of 30 MPa was applied from the start of temperature increase to the end of holding. After the end of holding, the product was naturally cooled as is in a chamber.

Subsequently, hot isostatic pressing was performed to the sintered compact that was removed from the hot press mold. The hot isostatic pressing conditions were as follows; namely, rate of temperature increase of 300° C./hour, holding temperature of 1200° C., and holding time of 2 hours, and the Ar gas pressure was gradually increased from the start of temperature increase, and pressure of 150 MPa was applied during the holding at 1200° C. After the end of holding, the product was naturally cooled in the furnace.

The density of the sintered compact prepared as described above was measured with the Archimedian method, and the relative density was calculated. The result was 98.1%.

Subsequently, the end part of the obtained sintered compact was cut out, and the cross-section surface was polished to observe the structure thereof with an electron-beam microanalyzer. An element distribution of the polished surface having a visual field size of 80 μm×80 μm was captured at four locations that were arbitrarily selected on the structure surface. The captured element distribution image of C was binarized using image-editing software to obtain the number and area of the portion corresponding to the C grains. As a result of calculating the mean area per one C grain, the result was 11.5 μm$^2$.

Subsequently, the sintered compact was cut with a lathe into a shape having a diameter of 180.0 mm and a thickness of 5.0 mm, and thereafter mounted on a magnetron sputtering device (C-3010 sputtering system manufactured by Canon Anelva) to perform sputtering.

The sputtering conditions were input power of 1 kW and Ar gas pressure of 1.7 Pa, and, after performing pre-sputtering of 2 kWhr, deposition was performed onto a silicon substrate having a 4-inch diameter for 20 seconds. The number of particles that adhered on the substrate was measured with a particle counter. The result was 510 particles.

Example 7

As the raw material powders, Fe powder having an average grain size of 3 μm, Pt powder having an average grain size of 3 μm, Cu power having an average grain size of 3 μm, C powder having an average grain size of 1 μm, and MgO powder having an average grain size of 2 μm were prepared. As the C powder, graphite powder having a true specific gravity of 2.25 g/cc was used.

These powders were weighed to achieve a total weight of 2500 g based on the following atomic ratio.

Atomic ratio: (Fe$_{45}$—Pt$_{45}$—Cu$_{10}$)$_{64}$—C$_{18}$—Mg$_9$—O$_9$

Subsequently, the weighed powders were placed in a ball mill pot with a capacity of 10 liters together with zirconia balls as the grinding medium, and the mill pot was rotated for 4 hours for mixing and pulverizing. The mixed powder that was removed from the ball mill was filled in a carbon mold and hot pressed.

The hot press conditions were as follows; namely, vacuum atmosphere, rate of temperature increase of 300° C./hour, holding temperature of 1250° C., and holding time of 2 hours, and pressure of 30 MPa was applied from the start of temperature increase to the end of holding. After the end of holding, the product was naturally cooled as is in a chamber.

Subsequently, hot isostatic pressing was performed to the sintered compact that was removed from the hot press mold. The hot isostatic pressing conditions were as follows; namely, rate of temperature increase of 300° C./hour, holding temperature of 1250° C., and holding time of 2 hours, and the Ar gas pressure was gradually increased from the start of temperature increase, and pressure of 150 MPa was applied during the holding at 1250° C. After the end of holding, the product was naturally cooled in the furnace.

The density of the sintered compact prepared as described above was measured with the Archimedian method, and the relative density was calculated. The result was 98.2%.

Subsequently, the end part of the obtained sintered compact was cut out, and the cross-section surface was polished to observe the structure thereof with an electron-beam microanalyzer. An element distribution of the polished surface having a visual field size of 80 μm×80 μm was captured at four locations that were arbitrarily selected on the structure surface. The captured element distribution image of C was binarized using image-editing software to obtain the number and area of the portion corresponding to the C grains. As a result of calculating the mean area per one C grain, the result was 2.6 μm².

Subsequently, the sintered compact was cut with a lathe into a shape having a diameter of 180.0 mm and a thickness of 5.0 mm, and thereafter mounted on a magnetron sputtering device (C-3010 sputtering system manufactured by Canon Anelva) to perform sputtering.

The sputtering conditions were input power of 1 kW and Ar gas pressure of 1.7 Pa, and, after performing pre-sputtering of 2 kWhr, deposition was performed onto a silicon substrate having a 4-inch diameter for 20 seconds. The number of particles that adhered on the substrate was measured with a particle counter. The result was 320 particles.

Example 8

As the raw material powders, Fe powder having an average grain size of 3 μm, Pt powder having an average grain size of 3 μm, C powder having an average grain size of 1 μm, and $Cr_2O_3$ powder having an average grain size of 3 μm were prepared. As the C powder, graphite powder having a true specific gravity of 2.25 g/cc was used.

These powders were weighed to achieve a total weight of 2600 g based on the following atomic ratio.

Atomic ratio: $(Fe_{60}-Pt_{40})_{62.5}-C_{16.67}-Cr_{8.33}-O_{12.50}$

Subsequently, the weighed powders were placed in a ball mill pot with a capacity of 10 liters together with zirconia balls as the grinding medium, and the mill pot was rotated for 4 hours for mixing and pulverizing. The mixed powder that was removed from the ball mill was filled in a carbon mold and hot pressed.

The hot press conditions were as follows; namely, vacuum atmosphere, rate of temperature increase of 300° C./hour, holding temperature of 1150° C., and holding time of 2 hours, and pressure of 30 MPa was applied from the start of temperature increase to the end of holding. After the end of holding, the product was naturally cooled as is in a chamber.

Subsequently, hot isostatic pressing was performed to the sintered compact that was removed from the hot press mold. The hot isostatic pressing conditions were as follows; namely, rate of temperature increase of 300° C./hour, holding temperature of 1150° C., and holding time of 2 hours, and the Ar gas pressure was gradually increased from the start of temperature increase, and pressure of 150 MPa was applied during the holding at 1150° C. After the end of holding, the product was naturally cooled in the furnace.

The density of the sintered compact prepared as described above was measured with the Archimedian method, and the relative density was calculated. The result was 96.7%.

Subsequently, the end part of the obtained sintered compact was cut out, and the cross-section surface was polished to observe the structure thereof with an electron-beam microanalyzer. An element distribution of the polished surface having a visual field size of 80 μm×80 μm was captured at four locations that were arbitrarily selected on the structure surface. The captured element distribution image of C was binarized using image-editing software to obtain the number and area of the portion corresponding to the C grains. As a result of calculating the mean area per one C grain, the result was 1.8 μm².

Subsequently, the sintered compact was cut with a lathe into a shape having a diameter of 180.0 mm and a thickness of 5.0 mm, and thereafter mounted on a magnetron sputtering device (C-3010 sputtering system manufactured by Canon Anelva) to perform sputtering.

The sputtering conditions were input power of 1 kW and Ar gas pressure of 1.7 Pa, and, after performing pre-sputtering of 2 kWhr, deposition was performed onto a silicon substrate having a 4-inch diameter for 20 seconds. The number of particles that adhered on the substrate was measured with a particle counter. The result was 260 particles.

The foregoing results are summarized in Table 1. As shown in Table 1, all Examples of the sputtering target of the present invention maintained a high density of the sputtering target, and the number of particles generated during the sputtering was 500 particles or less, and was constantly fewer than the Comparative Examples.

TABLE 1

| No. | Target composition (Atomic ratio) | Relative density (%) | C grains Mean area | C grains Material | Oxygen concentration (wt ppm) | Number of particles |
|---|---|---|---|---|---|---|
| Example 1 | $(Fe_{50}-Pt_{50})_{60}-C_{40}$ | 96.6 | 2.9 μm² | Amorphous carbon | 560 | 410 |
| Example 2 | $(Fe_{40}-Pt_{45}-Cu_{15})_{55}-C_{45}$ | 95.8 | 2.7 μm² | Amorphous carbon | 540 | 320 |
| Example 3 | $(Fe_{50}-Pt_{50})_{60}-C_{40}$ | 96.9 | 1.0 μm² | Amorphous carbon | 870 | 230 |
| Example 4 | $(Fe_{50}-Pt_{50})_{60}-C_{40}$ | 97.6 | 3.2 μm² | Graphite | 600 | 170 |

TABLE 1-continued

| No. | Target composition (Atomic ratio) | Relative density (%) | C grains Mean area | C grains Material | Oxygen concentration (wt ppm) | Number of particles |
|---|---|---|---|---|---|---|
| Example 5 | $(Fe_{50}-Pt_{50})_{60}-C_{40}$ | 97.1 | 2.6 μm$^2$ | Amorphous carbon | 280 | 360 |
| Example 6 | $(Fe_{50}-Pt_{50})_{69}-C_{10}-Si_7-O_{14}$ | 98.6 | 2.5 μm$^2$ | Graphite | — | 120 |
| Example 7 | $(Fe_{40}-Pt_{45}-Cu_{15})_{64}-C_{18}-Mg_9-O_9$ | 98.2 | 2.6 μm$^2$ | Graphite | — | 320 |
| Example 8 | $(Fe_{60}-Pt_{40})_{62.5}-C_{16.67}-Cr_{8.33}-O_{12.50}$ | 96.7 | 1.8 μm$^2$ | Graphite | — | 260 |
| Comparative Example 1 | $(Fe_{50}-Pt_{50})_{60}-C_{40}$ | 83.6 | 2.7 μm$^2$ | Amorphous carbon | 620 | 9640 |
| Comparative Example 2 | $(Fe_{50}-Pt_{50})_{40}-C_{60}$ | 87.8 | 6.2 μm$^2$ | Amorphous carbon | 820 | >20000 |
| Comparative Example 3 | $(Fe_{40}-Pt_{45}-Cu_{15})_{55}-C_{45}$ | 85.7 | 2.5 μm$^2$ | Amorphous carbon | 580 | 11210 |
| Comparative Example 4 | $(Fe_{50}-Pt_{50})_{69}-C_{10}-Si_7-O_{14}$ | 98.1 | 11.5 μm$^2$ | Graphite | — | 510 |

The present invention yields a superior effect of enabling the production of a magnetic thin film with granular structure without using an expensive simultaneous sputtering device, as well as providing a high-density Fe—Pt-based sputtering target, in which C grains are dispersed, capable of reducing the amount of particles generated during sputtering. Accordingly, the present invention is effective as a sputtering target for depositing a magnetic thin film with granular structure.

The invention claimed is:

1. A sputtering target, comprising a sintered compact having a composition expressed by a formula of $(Fe_{100-x}-Pt_x)_{100-A}-C_A$ where A and X are numerals in units of atomic percent satisfying respectively $20 \leq A \leq 50$ and $35 \leq X \leq 55$, wherein C grains are finely dispersed within a Fe—Pt matrix alloy of the sintered compact, the C grains in a polished surface of the sputtering target have a mean area of 4 μm$^2$ or less, and the sintered compact has an oxygen content of 600 wtppm or less and a relative density of 90% or higher.

2. The sputtering target according to claim 1, wherein the C grains are made of graphite.

3. The sputtering target according to claim 2, wherein the sintered compact contains an oxide of one or more elements selected from the group consisting of B, Mg, Al, Si, Ti, Cr, Zr, Nb, and Ta in an amount of 20 mol % or less that is finely dispersed in the Fe—Pt matrix alloy of the sintered compact.

4. The sputtering target according to claim 1, wherein the sintered compact contains an oxide of one or more elements selected from the group consisting of B, Mg, Al, Si, Ti, Cr, Zr, Nb, and Ta in an amount of 20 mol % or less that is finely dispersed in the Fe—Pt matrix alloy of the sintered compact.

5. A sputtering target, comprising a sintered compact having a composition expressed by a formula of $(Fe_{100-x}-Pt_x)_{100-A}-C_A$ where A, X, and Y are numerals in units of atomic percent satisfying respectively $20 \leq A \leq 50$, $35 \leq X \leq 55$, and $0.5 \leq Y \leq 15$, wherein C grains are finely dispersed within a Fe—Pt—Cu matrix alloy of the sintered compact, the C grains in a polished surface of the sputtering target have a mean area of 4 μm$^2$ or less, and the sintered compact has an oxygen content of 600 wtppm or less and a relative density of 90% or higher.

6. The sputtering target according to claim 5, wherein the C grains are made of graphite.

7. The sputtering target according to claim 6, wherein the sintered compact contains an oxide of one or more elements selected from the group consisting of B, Mg, Al, Si, Ti, Cr, Zr, Nb, and Ta in an amount of 20 mol % or less that is finely dispersed in the Fe—Pt—Cu matrix alloy of the sintered compact.

8. The sputtering target according to claim 5, wherein the sintered compact contains an oxide of one or more elements selected from the group consisting of B, Mg, Al, Si, Ti, Cr, Zr, Nb, and Ta in an amount of 20 mol % or less that is finely dispersed in the Fe—Pt—Cu matrix alloy of the sintered compact.

* * * * *

UNITED STATES PATENT AND TRADEMARK OFFICE
CERTIFICATE OF CORRECTION

PATENT NO. : 9,945,026 B2  
APPLICATION NO. : 13/880135  
DATED : April 17, 2018  
INVENTOR(S) : Atsushi Sato et al.

Page 1 of 1

It is certified that error appears in the above-identified patent and that said Letters Patent is hereby corrected as shown below:

In the Claims

Column 18, Lines 23-24, Claim 5 "$(Fe_{100-X}-Pt_X)_{100-A}-C_A$" should read "$(Fe_{100-X-Y}-Pt_X-Cu_Y)_{100-A}-C_A$"

Signed and Sealed this  
Second Day of October, 2018

Andrei Iancu  
*Director of the United States Patent and Trademark Office*